(12) United States Patent
Akai et al.

(10) Patent No.: US 7,939,999 B2
(45) Date of Patent: May 10, 2011

(54) ELECTROLUMINESCENCE DEVICE AND FUNCTIONAL DEVICE

(75) Inventors: Tomonori Akai, Tokyo (JP); Shigehiro Ueno, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 294 days.

(21) Appl. No.: 11/510,251

(22) Filed: Aug. 24, 2006

(65) Prior Publication Data

US 2007/0046192 A1    Mar. 1, 2007

(30) Foreign Application Priority Data

Sep. 1, 2005  (JP) .................... 2005-253857

(51) Int. Cl.
*H01L 51/50*  (2006.01)
(52) U.S. Cl. ............ 313/504; 445/24; 257/100
(58) Field of Classification Search ........ 313/504–512; 257/200; 445/24–25
See application file for complete search history.

(56) References Cited

U.S. PATENT DOCUMENTS

2003/0197197 A1 * 10/2003 Brown et al. .......... 257/200

FOREIGN PATENT DOCUMENTS

| EP | 1 179 862 A2 | 7/2001 |
|---|---|---|
| EP | 1 237 208 A2 | 2/2002 |
| GB | 2 400 980 A | 10/2004 |
| JP | 10-162959 | 6/1998 |
| JP | 2003-077651 | 3/2003 |
| JP | 2003-249366 A | 9/2003 |
| JP | 2003-338363 | 11/2003 |
| JP | 2004-127740 | 4/2004 |
| JP | 2004-296234 | 10/2004 |
| JP | 2004-335206 A | 11/2004 |

OTHER PUBLICATIONS

English Translation JP2004-296234.*

* cited by examiner

*Primary Examiner* — Nimeshkumar D Patel
*Assistant Examiner* — Mary Ellen Bowman
(74) *Attorney, Agent, or Firm* — Ladas & Parry LLP

(57) ABSTRACT

The present invention provides an electroluminescence device which can overcome a drawback that a light emitting layer deteriorates when a cathode layer is formed on the light emitting layer and has no decline in the original function; and a production method which is suitable for producing such an electroluminescence device. An electroluminescence device has a laminated structure wherein an anode layer, a light emitting layer, a charge transporting protection layer, and a cathode layer are successively formed on a substrate, in which the charge transporting protection layer comprises a transparent insulating material, or a transparent insulating material and a metal.

10 Claims, 1 Drawing Sheet ic devices, wherein a light emitting layer is sandwiched between a pair of electrodes and a voltage is applied to the electrodes across the electrodes so as to cause luminescence, exhibit high luminance and high response speed. Thus, attention has been paid to the devices and practical use of the devices has been advancing.

ELECTROLUMINESCENCE DEVICE AND FUNCTIONAL DEVICE

BACKGROUND OF THE INVENTION

1. Field of the Invention

The present invention relates to an electroluminescence device and a functional device.

2. Description of the Related Art

Out of various display devices, electroluminescence devices, wherein a light emitting layer is sandwiched between a pair of electrodes and a voltage is applied to the electrodes across the electrodes so as to cause luminescence, exhibit high luminance and high response speed. Thus, attention has been paid to the devices and practical use of the devices has been advancing.

In order to produce an electroluminescence device, adopted is a method of laminating, on a substrate, an anode layer, a light emitting layer and a cathode layer successively. In order to form the light emitting layer actually, various layers which constitute the light emitting layer are successively laminated.

Out of the above-mentioned layers, electroconductive layers such as the anode and the cathode are preferably laminated by sputtering for the production efficiency thereof. However, the underlying layer of the cathode layer is the light emitting layer; therefore, when the cathode layer is laminated, the performance of the light emitting layer is easily deteriorated by the exposure of the light emitting layer to sputtering particles, which have a high energy, or to a plasma atmosphere if plasma is used.

Incidentally, about any electroluminescence device, the material which constitutes its light emitting layer is sensitive to a physical or chemical environment change so that a dark spot may be frequently generated. Accordingly, in order to prevent the invasion of water content in the air, which is a cause of the dark spot, the whole of the electroluminescence device may be covered with a protection film for blocking the water content (Japanese Patent Application Laid-Open (JP-A) No. 2003-338363).

Suggested is also a manner of laminating, on a substrate, an anode, a sputtering protection layer and a cathode layer successively wherein the sputtering protection layer is composed of gold, nickel or aluminum (JP-A No. 2003-77651).

It is suggested that a cathode of an organic electroluminescence device is composed, from the organic light emitting layer, of an electron injecting electrode layer (composed of Mg, Ca, Ba or the like) and an amorphous transparent electroconductive film (composed of an In—Zn—O oxide film). This structure results in the evasion of an inclination to the invasion of water content or oxygen in the air into the cathode, which is composed of ITO or the like (JP-A No. 10-162959).

Furthermore, the following are suggested: an electroluminescence device comprising a substrate, a lower electrode, an organic EL (electroluminescence) layer, a buffer layer and an upper electrode wherein the buffer layer comprises a phthalocyanine compound doped with metal such as Au, Pt, Pd or Ag (JP-A No. 2004-296234); and an electroluminescence device having an electron transportation protecting layer made of a mixture wherein an alkali metal or alkaline earth metal such as Li, Cs, Ba, Sr or Ca is incorporated into an electron transporting organic material such as BCP (bathocuproine) (JP-A No. 2004-127740).

JP-A No. 2003-338363 states that when the protection film made of a high melting metal is formed on the cathode, the protection film can be formed by sputtering since the cathode, which has already been formed, functions as a buffer layer.

However, JP-A No. 2003-338363 never discloses any solution for a deterioration of the light emitting layer when the cathode is laminated.

JP-A No. 2003-77651 refers to a theme for overcoming a deterioration of the light emitting layer when the cathode is laminated. However, in the case of using the metal for the protection layer, the protecting function is more preferred as the thickness of the protection layer is larger. Conversely, however, the transparency becomes lower. It is therefore difficult to make the required protecting function and transparency compatible with each other.

According to JP-A No. 10-162959, at the time of forming the amorphous transparent electroconductive film on the electron injecting electrode layer by sputtering, the electron injecting layer, which is an underlying layer, may produce a protecting effect. However, if the electrode layer is made to have a thickness sufficient for exhibiting the protecting effect, a drawback that the transmittance declines is unavoidable.

JP-A No. 2004-296234 includes the restriction that metal-doped phthalocyanine is used, and JP-A No. 2004-127740 includes the restriction that alkali metal or alkaline earth metal doped BCP (bathocuproine) or the like is used; however, in the present invention, metal-doped phthalocyanine is not used. The work function of each of the metals used in JP-A No. 2004-127740, such as Li, Cs, Ba, Sr and Ca, is smaller than 3.0 eV; however, the work function of the metal used in the invention is 3.0 eV or more. Thus, the two are different from each other.

SUMMARY OF THE INVENTION

An object of the invention is to provide an electroluminescence device which can overcome the above-mentioned problems caused when a cathode layer is formed on a light emitting layer and has an original function that is not deteriorated, provide an electroluminescence device comprising a protection layer having a good balance between protecting function and transparency, and provide a production method which is suitable for producing such an electroluminescence device.

The inventors' investigations have made the following evident: before a cathode layer of an electroluminescence device is formed, a protection layer made of a transparent insulating material or a material wherein a metal is incorporated into a transparent insulating material is laminated, thereby restraining a light emitting layer deterioration, which has been hitherto caused at ease at the time of forming a cathode layer; even if such a layer is laminated in advance, the transparency of the device is not declined; and about performances of the resultant electroluminescence device, no problems are caused. Thus, the invention has been made.

Accordingly, a first aspect of the invention relates to an electroluminescence device comprising, on a substrate, an anode layer, a light emitting layer, and a cathode layer in this order, and further comprising a protection layer made mainly of a transparent insulating material between the light emitting layer and the second electrode layer.

A second aspect of the invention relates to the electroluminescence device according to the first aspect of the invention, wherein the protection layer comprises the transparent insulating material and a metal.

A third aspect of the invention relates to the electroluminescence device according to the second aspect of the invention, wherein the ratio by volume of the metal in the protection layer is 30% or less.

A fourth aspect of the invention is the electroluminescence device according to the second or third aspect, wherein the work function of the metal is 3.0 eV or more.

A fifth aspect of the invention relates to the electroluminescence device according to any one of the first to fourth aspects, wherein the thickness of the protection layer is 10 nm to 1000 nm.

A sixth aspect of the invention relates to a method for manufacturing an electroluminescence device, comprising the step of laminating, on a substrate, an anode layer, a light emitting layer, a protection layer made mainly of a transparent insulating material, and a cathode layer successively, wherein the lamination of the protection layer is performed by chemical vapor deposition, vacuum deposition, or coating, and the lamination of the cathode layer is performed by sputtering or ion plating.

A seventh aspect of the invention relates to the functional device comprising, on a substrate, an anode layer, a functional layer which exhibits a function by action of an electric field or current, and a cathode layer in this order, and further comprising a protection layer made mainly of a transparent insulating material between the functional layer and the cathode layer.

An eighth aspect of the invention relates to the functional device according to the seventh aspect of the invention, wherein the protection layer comprises the transparent insulating material and a metal.

According to the first aspect of the invention, the electroluminescence device has the protection layer, which is made mainly of a transparent insulating material, between the light emitting layer and the cathode layer, whereby there can be provided an electroluminescence device which makes it possible to restrain: a deterioration of the light emitting layer when the cathode layer is formed, as well as a decline in the transparency even if the thickness of the protection layer increases; and a deterioration of the original function of the device.

According to the second aspect of the invention, the protection layer is made of the transparent insulating material and a metal, whereby there can be provided an electroluminescence device which makes it possible to keep the electroconductivity of the protection layer more surely as well as exhibits the advantageous effect of the first aspect of the invention.

According to the third aspect of the invention, the ratio of the metal in the materials of the protection layer is defined; accordingly, there can be provided an electroluminescence device which can exhibit the advantageous effects of the second aspect of the invention more reliably.

According to the fourth aspect of the invention, the lower limit of the work function of the metal out of the materials of the protection layer is defined; accordingly, there can be provided an electroluminescence device wherein: the metal used in the protection layer is not limited to into any alkali metal or alkaline earth metal; a metal having a high work function can be used; and the oxidation resistance of the protection layer itself can be enhanced; as well as the advantageous effects of the second or third aspect of the invention can be exhibited.

According to the fifth aspect of the invention, the thickness of the protection layer is defined; accordingly, there can be provided an electroluminescence device not only which can exhibit the advantageous effects of any one of the first to fourth aspects of the invention, but also which can certainly attain the restriction of the deterioration of the light emitting layer when the cathode layer is formed and does not give any excessive resistance.

According to the sixth aspect of the invention, the protection layer is laminated by chemical vapor deposition, vacuum deposition, or coating, and the cathode layer is laminated by sputtering or ion plating; accordingly, there can be provided an electroluminescence device producing method which makes it possible to restrain a deterioration of the light emitting layer when the respective layers of this device are formed, and to laminate the cathode layer effectively.

According to the seventh aspect of the invention, the functional device has the protection layer, which is made mainly of a transparent insulating material, between its functional layer which exhibits a function by action of an electric field or current and its cathode layer; accordingly, there can be provided a functional device which makes it possible to restrain a deterioration of the functional layer when the cathode layer is formed.

According to the eighth aspect of the invention, the functional device has the protection layer, which is made of a transparent insulating material and a metal, between its functional layer which exhibits a function by action of an electric field or current and its cathode layer; accordingly, there can be provided the functional device makes it possible to restrain a deterioration of the functional layer when the cathode layer is formed.

DESCRIPTION OF THE PREFERRED EMBODIMENT

Figure 1:
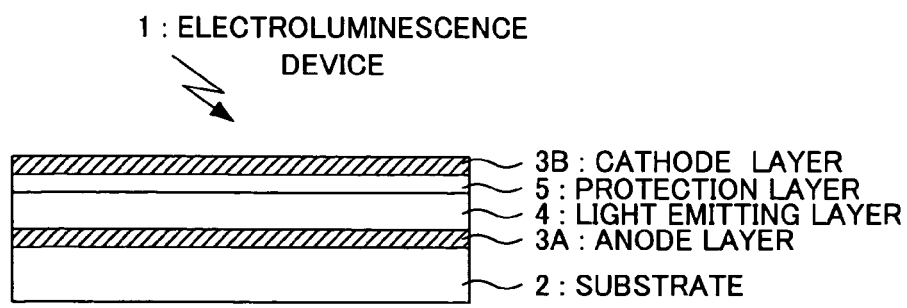
FIG. 1 is a view illustrating a laminated structure of an example of the electroluminescence device of the invention.

As illustrated in FIG. 1, a basic electroluminescence device 1 of the invention has a laminated structure wherein an anode layer 3A, a light emitting layer 4, a protection layer 5 and a cathode layer 3B are laminated on a substrate 2 in this order. The light emitting layer 4 itself may be a laminated structure composed of various layers, as will also be described later. A multi-photon structure wherein two or more devices which are each equivalent to the electroluminescence device 1 are laminated may be used.

As has been described in the item "Related Art", the upper surface of the cathode layer 3B or the whole of the electroluminescence device 1 may be covered with a coating layer having a moisture-proof property or the like.

In the protection layer 5, which is a characteristic member in the invention, is made mainly of a transparent insulating material, or is made of a transparent insulating material and a metal.

The protection layer 5 is preferably made of a transparent insulating material. Examples of the transparent insulating material include inorganic materials such as an oxide, nitride, fluoride or sulfide of a metal or a semiconductor, and mixtures thereof; and organic materials having a high transmittance to visible lights. The transmittance of the protection layer 5 is preferably 40% or more. If the protection layer 5 has a transmittance of 40% or more, electric characteristics of the protection layer is not necessarily limited. When the electroconductivity of the material constituting the protection layer 5 is high, the protection layer can be made from the material alone. If the electroconductivity of the material is low, the protection layer can be made by co-deposition of the material and a metal.

The above-mentioned metal oxide, nitride or oxynitride, or any similar transparent insulating material has a high transmittance in the range of visible ray wavelengths. Accordingly, even if the thickness increases, the transparency can be kept.

The protection layer 5 may be made of a transparent insulating material and a metal. Examples of the metal include Be, Mg, Sc, Y, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg, Al, Ga, In, Ti, Sn, Pb, and Bi. Out of these metals, metals having a work function of 3.0 eV or more are preferred.

When the protection layer 5 is made of a transparent insulating material and a metal, the ratio by volume of the metal is preferably 30% or less of the total of the transparent insulating material and the metal. If the ratio by volume of the metal is more than 30%, the protection layer 5 becomes opaque and further the insulation property of the protection layer 5 becomes low.

The thickness of the protection layer 5 is preferably 10 nm to 1000 nm. If the thickness of the protection layer is smaller than 10 nm, a sufficient protecting effect cannot be obtained so that a deterioration of the light emitting layer cannot be completely restrained. If the thickness of the protection layer is larger than 1000 nm, the resistance of the protection layer increases so that the resistance of the device becomes high.

When the protection layer 5 is made of a transparent insulating material and a metal and the ratio by volume of the metal in the total of the transparent insulating material and the metal (the concentration of the metal) increases, the electroconductivity of the protection layer rises. For this reason, even if the film thickness of the protection layer 5 is made into a large value of about 10 nm to 1000 nm, the resistance of the device does not become high. Accordingly, as the concentration of the metal is higher, the film thickness of the protection layer 5 can be made larger so that the protection layer 5 can be rendered a protection layer having a more reliable protecting effect. On the other hand, if the concentration of the metal is too high, the transmittance falls to cause a problem that the protection layer becomes opaque. It is therefore preferred that the protection layer 5 satisfies the above-mentioned requirements about the film thickness, metal concentration and transmittance.

The method for forming the protection layer 5 is more preferably a method of depositing a low-energy material by chemical vapor deposition, or vacuum deposition which is within the category of physical vapor depositions, than any method of depositing a high-energy material by sputtering or ion plating which is a physical vapor deposition, in order not to cause a deterioration of the light emitting layer 4 which is an underlying layer thereof. The protection layer 5 may be formed by coating. In the case of the formation by chemical vapor deposition or vacuum deposition, the kinetic energy of the gasified material is small; accordingly, the energy given to the light emitting layer 4, which is a target in forming the protection layer 5, is favorably small. In particular, in the case of vacuum deposition, a reactive gas, such as oxygen, is not introduced into the system. This is one of the reasons why the vacuum deposition is advantageous. Accordingly, when sputtering or ion plating is adopted, or even when chemical vapor deposition is adopted, it is preferred to introduce not any reactive gas, such as oxygen, but a gas having no reactivity, such as a rare gas.

Examples of the vacuum deposition include resistance heating deposition, flash deposition, arc deposition, laser deposition, high frequency induction heating deposition, and electron beam heating deposition.

Examples of the sputtering include DC diode sputtering, RF diode sputtering, triode sputtering, tetrode sputtering, ECR sputtering, ion beam sputtering, or magnetron sputtering. Other examples of the sputtering capable of restraining damage to the underlying layer include step sputtering, facing target sputtering, double V-shaped cathode facing target sputtering, plasma-restrained facing target sputtering, mirrortron sputtering, and facing and conical target sputtering.

The substrate 2 is a member for supporting the anode layer 3A and the layers formed subsequently to the formation of the layer 3A. In the case of taking out light generated by luminescence from the side of the substrate 2, it is preferred that the substrate 2 has transparency. However, in the case of taking out the light from the side of the cathode layer 3B, the substrate does not necessarily have transparency.

Specific examples of the material constituting the substrate 2 include inorganic materials, such as a quartz, a glass, a silicon wafer, and a glass plate on which TFT (thin film transistors) are formed.

The substrate may be made of a polymer such as polycarbonate (PC), polyethylene terephthalate (PET), polybutylene terephthalate (PBT), polyphenylene sulfide (PPS), polyimide (PI), polyamideimide (PAI), polyethersulfone (PES), polyetherimide (PEI), and polyetheretherketone (PEEK).

Of these, the substrate is preferably made of quartz, glass, a silicon wafer, or polyimide (PI), polyamideimide (PAI), polyethersulfone (PES), polyetherimide (PEI) or polyetheretherketone (PEEK), which is a super engineering plastic, out of the above-mentioned materials since the material has a heat resistance against temperatures of 200° C. or higher and thus the temperature of the substrate can be made high in the production process. In particular, in the case of producing an active driving display device wherein TFTs are used, the above-mentioned material can be preferably used since the substrate is exposed to high temperature in the production process thereof.

It is preferred that the thickness of the substrate 2 is appropriately selected in accordance with the material constituting the substrate 2 or the usage of the organic electroluminescence device. The thickness is, for example, about 0.005 mm to 5 mm.

When the substrate 2 is made of a polymeric material, the light emitting layer may be deteriorated by a gas generated from the polymeric material; it is therefore allowable to form a gas barrier layer, comprising silicon oxide silicon nitride or the like, between the substrate 2 and the anode layer 3A.

The anode layer 3A may be a positive electrode or a negative electrode, or may or may not be transparent or semitransparent in accordance with the manner of using the electroluminescence device 1. For example, in the case of taking out light from the side of the substrate 2, the anode layer 3A is preferably transparent or semitransparent. In the case of taking out light from the side of the cathode layer 3B, the anode layer 3A may not be necessarily transparent or semitransparent. In the case of taking out light from both of the side of the substrate 2 and the side of the cathode layer 3B, it is preferred that both of the anode layer 3A and the cathode layer 3B are transparent or semitransparent.

The material which constitutes the anode layer 3A is not particularly limited if the material is an electroconductive material. Examples thereof include metals such as Au, Ta, W, Pt, Ni, Pd, Cr, Cu, Mo, alkali metals and alkaline earth metals; oxides of these metals; and alloys such as Al alloys including AlLi, AlCa, AlMg or the like, Mg alloys including MgAg or the like, Ni alloys, Cr alloys, alkali metal alloys, and alkaline earth metal alloys.

These electroconductive materials may be used alone or in combination of two or more thereof. In the case of using two or more of these materials, layers made of the respective used materials may be laminated.

Furthermore, the electroconductive material may be an electroconductive inorganic oxide such as In—Sn—O, In—Zn—O, In—O, Zn—O, Zn—O—Al or Zn—Sn—O; an electroconductive polymer such as polythiophene, polyaniline, polyacetylene, a polyalkylthiophene derivative, or a polysilane derivative which is doped with a metal; α-Si or α-SiC; or the like.

Examples of the method for forming the anode layer 3A include sputtering, vacuum heating deposition, EB deposition, and ion plating.

The light emitting layer 4 may be made of a phosphor layer. In many cases, however, the light emitting layer 4 is made of a laminated structure wherein various layers, such as a positive hole injecting and transporting layer and an electron injecting layer, besides the phosphor layer are laminated to improve the electron- or positive hole-injecting or transporting property. Such a laminated structure can be classified into many types. For example, the following laminated structures (1) to (3) are recommendable. However, the laminated structure is not limited thereto.

Figure 2:
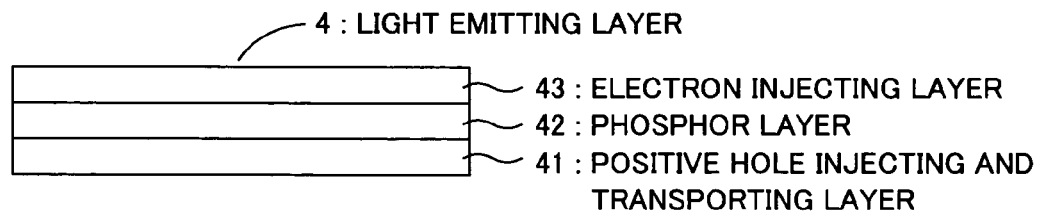
FIG. 2 is a view illustrating an example of the laminated structure of a light emitting layer in the invention.

(1) Positive hole injecting and transporting layer/phosphor layer (2) Phosphor layer/electron injecting layer (3) Positive hole injecting and transporting layer/phosphor layer/electron injecting layer An example of the light emitting layer 4 having a laminated structure as described above is shown in FIG. 2. In this structure, a positive hole injecting and transporting layer 41, a phosphor layer 42, and an electron injecting layer 43 are laminated successively.

A layer which has plural functions together by mixing materials having different functions with each other may be formed without forming the layers having different functions separately as described above.

The following will describe each of the positive injecting and transporting layer, the phosphor layer, and the electron injecting layer.

The material which constitutes the positive hole injecting and transporting layer is not particularly limited if the material is a material capable of transporting positive holes injected from the anode stably into the light emitting layer. Examples thereof include phenylamine compounds, starburst amine compounds, phthalocyanine compounds, oxides such as vanadium oxide, molybdenum oxide, ruthenium oxide and aluminum oxide, amorphous carbon, and polyaniline, polythiophene and polyphenylenevinylene and derivatives thereof. Specific examples thereof include bis (N-(1-naphthyl-N-phenyl)benzidine (α-NPD),
4,4,4-tris(3-methylphenylphenylamino)triphenylamine (MTDATA),
poly-3,4-ethylenedioxythiophene-polystyrenesulfonic acid (PEDOT-PSS), and polyvinylcarbazole (PVCz).

The thickness of the positive hole injecting and transporting layer is not particularly limited if the thickness is a thickness making it possible to exhibit sufficiently a function of injecting positive holes from the anode layer or cathode layer, and of transporting the positive holes to the light emitting layer. Specifically, the thickness is preferably 0.5 nm to 300 nm, more preferably 10 nm to 100 nm.

The method for forming the positive hole injecting and transporting layer may be, for example, deposition (vapor deposition), printing, ink-jetting, spin coating, casting, dipping, bar coating, blade coating, roll coating, gravure coating, flexography, spray coating, or self-organization (alternating absorption process or self-organizing monomolecular membrane process). However, the method is not limited thereto. Of these methods, particularly preferred is vapor deposition, spin-coating, or ink-jetting.

The phosphor layer is a layer having a function of supplying a site for recombination of electrons with positive holes to cause light emission. The layer is usually made of a colorant light emitting material, a metal complex light emitting material or a polymer light emitting material.

Examples of the colorant light emitting material which can constitute the phosphor layer include cyclopentadiene derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene ring compounds, pyridine ring compounds, perynone derivatives, perylene derivatives, oligothiophene derivatives, trifumanylamine derivatives, coumalin derivatives, an oxadiazole dimer, and a pyrrazoline dimer.

Examples of the metal complex light emitting material which can constitute the phosphor layer include an aluminum quinolinol complexes, a beryllium benzoquinolinol complex, a zinc benzooxazole complex, a zinc benzothiazole complex, a zinc azomethyl complex, a zincporphyrin complex, europium complexes, iridium metal complexes, platinum metal complexes, and metal complexes each having, as a central metal, Al, Zn, Be, Ir, Pt or a rare earth metal such as Tb, Eu or Dy and, as a ligand, oxadiazole, thiadiazole, phenylpyridine, phenylbenzoimidazole, a quinoline structure, or the like. Specifically, a tris(8-quinolinolato)aluminum complex (Alq3) can be used.

Examples of the polymer light emitting material which can constitute the phosphor layer include polyparaphenylenevinylene derivatives, polythiophene derivatives, polyparaphenylene derivatives, polysilane derivatives, polyacetylene derivatives, polyvinylcarbazole, polyfluorenone derivatives, polyfluorene derivatives, polyquinoxaline derivatives, polydialkylfluorene derivatives, and copolymers made from two or more of these materials. The polymer light emitting material may be a polymer obtained by polymerizing one or more of the above-mentioned colorant light emitting materials and metal complex light emitting materials.

The thickness of the phosphor layer is not particularly limited if the thickness makes it possible to express the function of supplying a site for recombination of electrons with positive holes to cause light emission. The thickness may be, for example, about 1 nm to 200 nm.

A dopant, which emits fluorescence or phosphorescence, may be incorporated into the phosphor layer in order to improve the light emitting efficiency or change the emission wavelength. Examples of such dopant include perylene derivatives, coumalin derivatives, rubrene derivatives, quinacridone derivatives, squalium derivatives, porphyrin derivatives, styryl colorants, tetracene derivatives, pyrazoline derivatives, decacyclene, phenoxazone, quinoxaline derivatives, carbazole derivatives, and fluorene derivatives.

The method for forming the phosphor layer is not particularly limited if the method is a method making it possible to form a micro pattern required for the electroluminescence device. For example, deposition (vapor deposition), printing, ink-jetting, spin coating, casting, dipping, bar coating, blade coating, roll coating, gravure coating, flexography, spray coating, or self-organization (alternating absorption process or self-organizing monomolecular membrane process). Of these methods, particularly preferred is vapor deposition, spin-coating, or ink-jetting.

When the electroluminescence device 1 is used to produce a full color display or a multicolor display, it is necessary to form phosphor layers which emits different colors into micro forms and put the micro forms into a given arrangement. Accordingly, the phosphor layers may be required to be patterned. About the patterning of the phosphor layers, a masking method is used to apply or vapor-deposit the raw materials of the layers separately for the different emission colors. Alternatively, the patterning is performed by printing or ink-jetting. Partitioning walls may be positioned between the arranged phosphor layers. When the partitioning walls are present, there is generated an advantage that when any one of the phosphor layers is formed by ink-jetting, the luminescent material does not spread into areas adjacent to the area for the luminescent material. The partitioning walls themselves can be made of a photosetting resin resin such as photosensitive polyimide resin or acrylic resin, a thermosetting resin, an inorganic material, or the like. A treatment for changing the surface energy (wettability) of the material for forming the partitioning walls may be conducted.

The material which constitutes the electron injecting layer is not particularly limited if the material is a material capable of stabilizing the injection of electrons into the light emitting layer. Examples thereof include alkali metals, alkaline earth metals, alkali metal oxides, alkaline earth metal oxides, alkali metal fluorides, alkaline earth metal fluorides, and organic complexes of alkali metals, such as aluminum, strontium, calcium, lithium, cesium, magnesium oxide, aluminum oxide, strontium oxide, lithium oxide, lithium fluoride, magnesium fluoride, strontium fluoride, calcium fluoride, barium fluoride, cesium fluoride, and polymethyl methacrylate sodium polystyrenesulfonate. Of these, alkaline earth metal fluorides can be preferably used since alkaline earth metal fluorides make it possible to improve the stability and the lifespan of the organic EL layer. This is because: alkaline earth metal fluorides have a lower reactivity with water than the above-mentioned alkali metal compounds or other alkaline earth metal oxides, so as to have a smaller water absorption when or after the electron injecting layer is formed; and alkaline earth metal fluorides each have a higher melting point than the above-mentioned alkali metal compounds so as to have a better heat resisting stability.

The thickness of the electron injecting layer is preferably about 0.2 nm to 20 nm under consideration of the electroconductivity or transmittance of the above-mentioned alkali metal or alkaline earth metal compounds.

The material, which constitutes the cathode layer 3B, and the method for forming the cathode layer 3B, is the same as described about the anode layer 3A.

The above has chiefly described examples wherein the invention is applied to an organic electroluminescence device. However, the scope where the invention can be applied is not only organic electroluminescence devices since such a protection layer as in the invention can widely be applied to devices for which carrier injection and transportation are required and for which a function of restraining damages when a cathode layer or the like is formed on a functional layer such as a light emitting layer by vacuum film-formation is desired.

Specifically, the above-mentioned light emitting layer may be any one of various functional layers which each exhibits a function by an electric field or current. The invention can be applied to any functional device comprising such a functional layer. Examples of the functional layer include an inorganic electroluminescence layer, a transistor layer, a memory layer, a solar cell layer, and a liquid crystal layer.

EXAMPLES

Example 1

A thin film (thickness: 150 nm) made of indium tin oxide (ITO) was first formed as an anode layer on a glass substrate by sputtering. After the formation of the anode, the substrate was washed and subjected to UV ozone treatment. Thereafter, in the atmosphere, a solution of polyethylenedioxythiophene-polystyrenesulfonate (abbreviated to "PEDOT-PSS") was applied on the ITO thin film by spin coating, and then dried to form a positive hole injecting and transporting layer (thickness: 80 nm).

Next, in a glove box having a low oxygen condition (oxygen concentration: 0.1 ppm or less) and a low humidity (water vapor concentration: 0.1 ppm or less), a solution of a fluorene copolymer (product number: ADS 133 YE, manufactured by American Dye Source Inc.) was applied on the positive hole injecting and transporting layer by spin coating, and then dried to form a light emitting layer (thickness: 80 nm).

In a vacuum (pressure: $1 \times 10^{-4}$ Pa), a Ca thin film (thickness: 10 nm) was formed as an electron injecting layer on the light emitting layer formed on the substrate by resistance heating deposition.

Next, in the vacuum (pressure: $1 \times 10^{-4}$ Pa), SiO and Ag were co-deposited into a protection layer (thickness: 100 nm) on the electron injecting layer by resistance heating deposition. The ratio by volume of Si/Ag in the used deposition source was as follows: SiO/Ag=97/3. The film-forming rate of SiO was 0.97 Å/s, and the film-forming rate of Ag was 0.03 Å/s.

Furthermore, a thin film (thickness: 150 nm) made of IZO was formed as a cathode on the protection layer by facial target sputtering.

After the formation of the cathode, in a glove box having a low oxygen condition (oxygen concentration: 0.1 ppm or less) and a low humidity (water vapor concentration: 0.1 ppm or less), the resultant was sealed with non-alkali glass, so as to yield an organic EL device.

A voltage was applied to the resultant organic EL device across its anode and cathode. The voltage at which a luminance of 0.01 cd/m² was obtained (light emission starting voltage) was then measured. The voltage was 4.1 V. The organic EL device was observed with the naked eye. As a result, defects, such as a dark spot, were not generated.

Comparative Example 1

An organic EL device was obtained in the same manner as in Example 1 except that no protection layer was formed and further IZO was formed into a film, as a cathode, directly on the electron injecting layer.

About the organic EL device obtained in Comparative Example 1, the light emission starting voltage thereof was measured in the same manner as in the case of the organic EL device obtained in Example 1. As a result, the voltage was 6.0 V.

Accordingly, from the different results about the light emission starting voltages of the organic EL devices obtained in Comparative Example 1 and Example 1, the following was proved: in the organic EL device of Comparative Example 1, wherein no protection layer was formed, the light emission characteristics were declined by sputtering-damages which the electron injecting layer and the light emitting layer underwent at the time of forming the cathode; on the other hand, in the organic EL device of Example 1, wherein the protection layer was formed, sputtering damages were restrained.

Comparative Example 2

An organic EL device was obtained in the same manner as in Example 1 except that the protection layer and the IZO thin film were not formed and in a vacuum (pressure: $1 \times 10^{-4}$ Pa)

a Ag thin film (thickness: 150 nm) was formed, as a cathode, directly on the electron injecting layer by resistance heating deposition.

About the organic EL device obtained in Comparative Example 2, the light emission starting voltage thereof was measured in the same manner as in the case of the organic EL device obtained in Example 1. As a result, the voltage was 3.8 V.

Accordingly, from the results of Comparative Example 2 and Example 1, the following was proved: in an organic EL device wherein a protection layer is formed before the formation of a cathode, its characteristics are hardly declined even if the film is formed on the cathode by sputtering, this matter being different from the case where the cathode is formed by vapor deposition.

Comparative Example 3

An organic EL device was obtained in the same manner as in Example 1 except that resistance heating deposition was used to form a Ag thin film (thickness: 1 nm) instead of the film made of the co-deposited SiO and Ag as the protection layer.

About the organic EL device obtained in Comparative Example 3, the light emission starting voltage thereof was measured in the same manner as in the case of the organic EL device obtained in Example 1. As a result, the voltage was 5.4 V.

Comparative Example 4

An organic EL device was obtained in the same manner as in Example 1 except that resistance heating deposition was used to form a Ag thin film (thickness: 10 nm) instead of the film made of the co-deposited SiO and Ag as the protection layer.

About the organic EL device obtained in Comparative Example 4, the light emission starting voltage thereof was measured in the same manner as in the case of the organic EL device obtained in Example 1. As a result, the voltage was 5.3 V.

From the results of Example 1, and Comparative Examples 3 and 4, it was proved that when the thickness of the protection layer becomes small, the light emission characteristics are declined.

Example 2

An organic EL device was obtained in the same manner as in Example 1 except that the thickness of the protection layer was set to 10 nm.

About the organic EL device obtained in Example 2, the light emission starting voltage thereof was measured in the same manner as in the case of the organic EL device obtained in Example 1. As a result, the voltage was 4.5 V. From the results of Examples and 1 and 2 and Comparative Example 1, it was proved that when the thickness of the protection layer is set to 10 nm, the light emission characteristics are better than when no protection layer is formed, but the protecting effect becomes smaller so that the light emission characteristics become lower than when the thickness of the protection layer is 100 nm.

Example 3

An organic EL device was obtained in the same manner as in Example 1 except that the thickness of the protection layer was set to 280 nm.

About the organic EL device obtained in Example 3, the light emission starting voltage thereof was measured in the same manner as in the case of the organic EL device obtained in Example 1. As a result, the voltage was 4.0 V. From this result, it was proved that even if the thickness of the protection layer is increased up to 280 nm, the protecting effect continues so that the light emission characteristics are not declined.

Example 4

A thin film (thickness: 150 nm) made of indium tin oxide (ITO) was first formed as an anode layer on a glass substrate by sputtering. After the formation of the anode, the substrate was washed and subjected to UV ozone treatment. Thereafter, in the atmosphere, a solution of polyethylenedioxythiophene-polystyrenesulfonate (abbreviated to "PEDOT-PSS") was applied on the ITO thin film by spin coating, and then dried to form a positive hole injecting and transporting layer (thickness: 80 nm).

Next, in a vacuum (pressure: $1 \times 10^{-4}$ Pa), films of α-NPD (thickness: 40 nm), Alq3 (thickness: 60 nm), LiF (thickness: 0.5 nm) and Ca (thickness: 10 nm) were formed successively on the light emitting layer by resistance heating deposition. In this way, a positive hole transporting layer, a light emitting layer and an electron injecting layer were formed.

In a vacuum (pressure: $1 \times 10^{-4}$ Pa), a Ca thin film was formed as an electron injecting layer on the light emitting layer formed on the substrate by resistance heating deposition.

Next, in the vacuum (pressure: $1 \times 10^{-4}$ Pa), SiO and Ag were co-deposited into a protection layer (thickness: 100 nm) on the electron injecting layer by resistance heating deposition. The ratio by volume of Si/Ag in the used deposition source was as follows: SiO/Ag=97/3. The film-forming rate of SiO was 0.97 Å/s, and the film-forming rate of Ag was 0.03 Å/s.

Furthermore, a thin film (thickness: 150 nm) made of IZO was formed as a cathode on the protection layer by facial target sputtering.

After the formation of the cathode, in a glove box having a low oxygen condition (oxygen concentration: 0.1 ppm or less) and a low humidity (water vapor concentration: 0.1 ppm or less), the resultant was sealed with non-alkali glass, so as to yield an organic EL device.

About the organic EL device obtained in Example 4, the light emission starting voltage thereof was measured in the same manner as in the case of the organic EL device obtained in Example 1. As a result, the voltage was 2.35 V. The organic EL device was observed with the naked eye. As a result, defects, such as a dark spot, were not generated.

Comparative Example 5

An organic EL device was obtained in the same manner as in Example 6 except that no protection layer was formed and further IZO was formed into a film, as a cathode, directly on the electron injecting layer.

About the organic EL device obtained in Comparative Example 5, the light emission starting voltage thereof was measured in the same manner as in the case of the organic EL device obtained in Example 6. As a result, the voltage was 2.4 V.

Accordingly, from the different results about the light emission starting voltages of the organic EL devices obtained in Comparative Example 5 and Example 6, the following was proved: in the organic EL device of Comparative Example 5, wherein no protection layer was formed, the light emission characteristics were declined by sputtering-damages which the electron injecting layer and the light emitting layer underwent at the time of forming the cathode; on the other hand, in the organic EL device of Example 6, wherein the protection layer was formed, sputtering damages were restrained.

Comparative Example 6

An organic EL device was obtained in the same manner as in Example 6 except that the protection layer and the IZO thin film were not formed and in a vacuum (pressure: $1 \times 10^{-4}$ Pa) a Ag thin film (thickness: 150 nm) was formed, as a cathode, directly on the electron injecting layer by resistance heating deposition.

About the organic EL device obtained in Comparative Example 6, the light emission starting voltage thereof was measured in the same manner as in the case of the organic EL device obtained in Example 7. As a result, the voltage was 2.3 V.

Accordingly, from the results of Comparative Example 6 and Example 6, the following was proved: in an organic EL device wherein a protection layer is formed before the formation of a cathode, its characteristics are declined a little even if the film is formed on the cathode by sputtering, this matter being different from the case where the cathode is formed by vapor deposition.

Only a co-deposited film (thickness: 100 nm) of SiO and Ag was formed on the same glass substrate as used in Example 1. Conditions for forming this film were the same as in Example 1.

The transmittance of the resultant co-deposited film of SiO and Ag was measured with a spectrophotometer. As a result, the transmittance was 98% at a wavelength of 550 nm. Thus, it was proved that the film had a high transparency.

It was proved from the measurement results of the transmittance of the co-deposited film of SiO and Ag that a co-deposited film of SiO and Ag has a high transparency even if the film thickness thereof is several tens of nanometers.

Only a Ag thin film (thickness: 1 nm) was formed on the same glass substrate as used in Example 1 by resistance heating deposition. Conditions for forming this thin film were the same as in Comparative Example 3.

Only a Ag thin film (thickness: 10 nm) was formed on the same glass substrate as used in Example 1 by resistance heating deposition. Conditions for forming this thin film were the same as in Comparative Example 4.

The transmittance of each of the resultant Ag thin films was measured with the spectrophotometer. As a result, the transmittance of the film 1 nm in thickness was 92% and that of the film 10 nm in thickness was 41%. From these results, it was proved that in a Ag thin film 10 nm or more in thickness, the transmittance thereof lowers largely.

The thickness of each of the layers was estimated from the film-forming rate obtained by using, as a standard, the film thickness in the case of forming each of the layers in a mono-layered form on a washed glass substrate. For the film-thickness measurement, a probe microscope (Nanopics 1000, manufactured by SII Nano Technology Inc.) was used.

What is claimed is:

1. An electroluminescence device comprising, on a substrate, an anode layer, a light emitting layer, and a cathode layer in this order, and further comprising a protection layer made of a transparent insulating material and a metal between the light emitting layer and the cathode layer, wherein the transparent insulating material is made of an oxide, a nitride, a fluoride or a sulfide of a metal, and wherein a ratio by volume of the metal in the protection layer is 30% or less, and a thickness of the protection layer is 280 nm to 1000 nm.

2. The electroluminescence device according to claim 1, wherein the transparent insulating material is the metal oxide, the metal nitride or a metal oxynitride.

3. The electroluminescence device according to claim 1, wherein the transparent insulating material is a silicon oxide.

4. The electroluminescence device according to claim 1.

5. A method for manufacturing an electroluminescence device, comprising the step of laminating, on a substrate, an anode layer, a light emitting layer, a protection layer made of a transparent insulating material and a metal, and a cathode layer successively, wherein the transparent insulating material is made of an oxide, a nitride, a fluoride or a sulfide of a metal, wherein the lamination of the protection layer is performed by chemical vapor deposition, vacuum deposition, or coating, and the lamination of the cathode layer is performed by sputtering or ion plating, and wherein a ratio by volume of the metal in the protection layer is 30% or less, and a thickness of the protection layer is 280 nm to 1000 nm.

6. The method for manufacturing an electroluminescence device according to claim 5, wherein the transparent insulating material is the metal oxide, the metal nitride or a metal oxynitride.

7. The method for manufacturing an electroluminescence device according to claim 5, wherein the transparent insulating material is a silicon oxide.

8. A functional device comprising, on a substrate, an anode layer, a functional layer which exhibits a function by action of an electric field or current, and a cathode layer in this order, and further comprising a protection layer made of a transparent insulating material and a metal between the functional layer and the cathode layer, wherein the transparent insulating material is made of an oxide, a nitride, a fluoride or a sulfide of a metal, and wherein a ratio by volume of the metal in the protection layer is 30% or less, and a thickness of the protection layer is 280 nm to 1000 nm.

9. The functional device according to claim 8, wherein the transparent insulating material is the metal oxide, the metal nitride or a metal oxynitride.

10. The functional device according to claim 8, wherein the transparent insulating material is a silicon oxide.

* * * * *